United States Patent [19]

Johnson et al.

[11] Patent Number: 4,717,597

[45] Date of Patent: Jan. 5, 1988

[54] METHOD FOR PROVIDING IMPURITIES INTO A CARRIER GAS LINE

[75] Inventors: Eric S. Johnson, Scottsdale; Neal J. Mellen, Tempe, both of Ariz.

[73] Assignee: Motorola Inc., Schaumburg, Ill.

[21] Appl. No.: 842,690

[22] Filed: Mar. 21, 1986

[51] Int. Cl.⁴ .............................................. C23C 16/30
[52] U.S. Cl. ................................. 437/81; 427/255;
427/255.2; 427/255.7; 427/419.1; 437/225
[58] Field of Search ............. 427/85, 87, 255.3, 255.2, 427/255.7, 255, 162, 126.1, 419.1

[56] References Cited

U.S. PATENT DOCUMENTS

| | | | |
|---|---|---|---|
| 3,425,879 | 2/1969 | Shaw et al. | 427/255.2 |
| 4,142,924 | 3/1979 | Hsieh | 427/87 |
| 4,188,244 | 2/1980 | Itoh et al. | 427/87 |
| 4,250,205 | 2/1981 | Constant et al. | 427/87 |
| 4,311,743 | 1/1982 | Kasper et al. | 427/87 |
| 4,350,653 | 9/1982 | Burnett et al. | 264/127 |
| 4,430,282 | 2/1984 | Stack | 264/127 |
| 4,561,916 | 12/1985 | Akiyama et al. | 427/87 |

*Primary Examiner*—Sadie L. Childs
*Attorney, Agent, or Firm*—Joe E. Barbee

[57] ABSTRACT

A permeable tube is inserted in a processing gas line to allow impurities surrounding the permeable tube to enter the processing line. By plumbing a steel tube in parallel with the permeable tube the process carrier gas can be switched from one tube to the other in rapid succession to allow pure or impure gases to enter into a reaction chamber. This can permit the growth of alternating layers of differently doped materials. As an example, it has been discovered that incorporating small amounts of oxygen into an AlGaAs layer will produce a semi-insulating layer.

9 Claims, 2 Drawing Figures 4,717,597

METHOD FOR PROVIDING IMPURITIES INTO A CARRIER GAS LINE

BACKGROUND OF THE INVENTION

This invention relates, in general, to chemical vapor deposition of semiconductor wafers, and more particularly, to a method for introducing impurities into a carrier gas line going to a reaction chamber.

During the manufacture of semiconductor devices there is often the requirement for a dielectric layer such as a layer of $SiO_2$, $Si_2N_3$, or the like to provide electrical isolation. In some laser or LED structures manufactured with a multiplicity of layers of GaAs and AlGaAs it is desirable to have an insulating layer as a top layer covering the GaAs cap layer. Sources of gases to form these layers are typically connected to a manifold which controllably allocates the desired dopant or gas to the reaction chamber. It has been discovered that a semi-insulating layer can be obtained by incorporating small amounts of an oxygen containing species such as $O_2$, $H_2O$, or the like into an AlGaAs layer. One way of getting the oxygen into the system is by feeding the oxygen or water vapor through a needle valve or mass flow controller into the gas carrier line going to the reaction chamber. However, flow volume changes are generally necessary when using the needle valve and it is extremely difficult to obtain reproducibly the required parts per million levels of impurities in the carrier gas.

Accordingly, it is an object of the present invention to provide an improved method for adding an impurity into a carrier gas line to a reaction chamber.

Another object of the present invention is to provide an improved method for obtaining semi-insulating layers in a semiconductor structure.

Yet another object of the present invention is to provide a method for using a permeable tube to add dopants into a semiconductor processing system.

A further object of the present invention is to provide a semi-insulating layer by adding oxygen to AlGaAs.

SUMMARY OF THE INVENTION

The above and other objects and advantages of the present invention are provided by using a permeable tube in a carrier gas line going to a reaction chamber. The permeable tube is exposed to the dopant or impurity thereby causing the impurity to diffuse into the carrier gas through the permeable tube.

A layer of AlGaAs is made insulating by placing the permeable tube in ambient air so that oxygen or water vapor in the air is added to the reagents which produce AlGaAs in order to produce a semi-insulating layer.

The subject matter which is regarded as the invention is set forth in the appended claims. The invention itself, however, together with further objects and advantages thereof, may be better understood by referring to the following detailed description taken in conjunction with the accompanying drawings.

The exemplification set out herein illustrates a preferred embodiment of the invention in one form thereof, and such exemplification is not to be construed as limiting in any manner.

DETAILED DESCRIPTION OF THE DRAWINGS

It has been discovered that unintentionally doped AlGaAs grown by metal organic chemical vapor deposition (MOCVD) in a range near 600° C. to 900° C. is highly compensated (semi-insulating) and has low photoluminescense efficiency when a permeable inlet tube is used to transport process gases from a mixing manifold to a reaction chamber. The AlGaAs is of high quality when the permeable inlet tube is replaced with a steel inlet tube. By plumbing the permeable tube in parallel with the the steel tube the process gas may be rapidly switched from one to the other to produce a lattice matched AlGaAs with either high optical/electrical quality or with insulating properties. The addition of oxygen provides a layer of AlGaAs:O which is used to provide current confinement. It also simplifies device processing.

Figure 1:
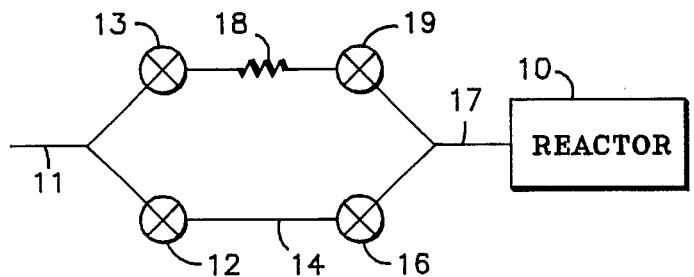
FIG. 1 shows in skeleton form an application of the present invention.

FIG. 1 illustrates in skeleton form a reaction chamber 10 having parallel plumbed inlet lines. The process gas, such as a reagent, flowing from a mixture and control manifold is fed to input line 11. Input line 11 goes to shutoff valves 12 and 13. Shutoff valve 12 is coupled by a steel tube 14 to shut off valve 16. The output of shutoff valve 16 is coupled by line 17 to reaction chamber 10. Shutoff valve 13 is coupled by a permeable tube 18 to shutoff valve 19. The output of shutoff valve 19 is coupled by line 17 to reaction chamber 10.

When a high purity layer is desired to be deposited in reaction chamber 10, shutoff valves 13 and 19 are closed and shutoff valves 12 and 16 are open thereby allowing process carrier gases entering line 11 to flow through line 14 and line 17 into reaction chamber 10. If it is desired to add an impurity to the process gases entering line 11 then shutoff valves 12 and 16 are closed and shutoff valves 13 and 19 are open thereby allowing the process gases to flow through permeable tube 18 and line 17 into reaction chamber 10. The impurities added to the process gases would be the impurities surrounding permeable tube 18.

It has been found that a Teflon (a trademark of E. I. DuPont De Nemours & Co., Inc.) tube serves very nicely as a permeable tube 18. The amount of impurities added to the system can be controlled by varying the carrier gas flow, changing the length of the Teflon (tetrafluoroethylene resin) tube, changing the diameter or wall thickness of the tube, or by changing the temperature of the tube. It has been found that with a carrier gas flow of 5 to 10 liters per minute, a mole fraction of group III reagent of $8 \times 10^{-5}$, a 38 centimeter length of tetrafluoroethylene resin tube approximately 1.3 centimeters in diameter having approximately 1.0 millimeter thickness wall provided a semi-insulating AlGaAs:O layer.

Figure 2:
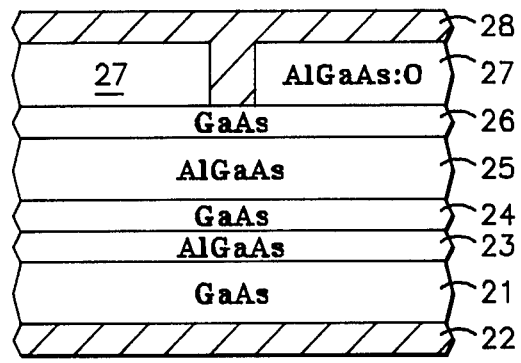
FIG. 2 illustrates a cross-sectional view of a portion of an LED or laser structure which can be made by practicing the present invention.

FIG. 2 illustrates in cross-sectional view a portion of an example of a device which could be made using the invention shown in FIG. 1. The example illustrated in FIG. 2 is a laser/LED structure built on a GaAs substrate 21. A confinement layer illustrated as AlGaAs 23 is formed on top of substrate 21. An active GaAs region 24 is then formed over confinement layer 23. A second confinement layer 25 of AlGaAs is formed over active layer 24. Confinement layer 25 is then covered with a GaAs cap layer 26. At this point of the manufacture of the structure of FIG. 2 shutoff valves 12 and 16 would be closed and valves 13 and 19 would be opened so that the process gases used to form top insulating layer 27 would have oxygen which is obtained from ambient air surrounding permeable tube 18. This step would form an AlGaAs:O insulating layer 27 which is lattice matched to layer 26. By plumbing permeable tube 18 in parallel with regular tube 14 the processing gases can be rapidly switched from one to the other.

In a preferred embodiment of the example illustrated in FIG. 2 layers 21 and 23 exhibit an N-type conductivity while layers 24, 25, and 26 exhibit a P-type conductivity. The oxygen added to the AlGaAs destroys the optical and electrical properties of AlGaAs layer 27, and therefore layer 27 can be used as a semi-insulating layer and still allow growth on top of it or allow deposition of contact layer 28.

In making the laser/LED structure illustrated in FIG. 2, the AlGaAs:O layer will be etched to the GaAs cap layer 26 to define the stripe in a single non-critical processing step. AlGaAs:O layer 27 replaces a variety of previously used dielectrics such as $SiO_2$, $Si_2N_3$, proton implantations, or etch processes to remove part of the cap layer 26. AlGaAs:O layer 27 is part of the grown crystal structure and it therefore does not peel off; furthermore, the stress from insulating layer 27 is minimized. Layer 27 can be made quite thick (10 micrometers or larger) and give increased separation to the large ohmic metal contact layers, which act as capacitor plates. The bottom ohmic of the laser/LED structure is illustrated as metal layer 22 while the top ohmic is illustrated by metal layer 28.

The series resistance of the device of FIG. 2 can be decreased by making substrate 21 thinner; however, the capacitance between metal layers 22 and 28 will then increase. Use of the present invention allows making the substrate thinner while maintaining the capacitance at a low value since the thickness of insulating layer 27 can be easily increased to make up for the reduced thickness of the substrate. These techniques should result in a laser/LED structure which has higher operating or modulation frequencies than a similar device not incorporating the present invention.

Although in the present invention the permeable tube has been illustrated as located in ambient air, the artesian will recognize that the tube can be placed in an enclosure which may be pressurized with whatever impurity or dopant it is desired to have enter the carrier gas line and carried into reaction chamber 10. This would allow varying gas concentrations in the enclosing container and would also allow control of the temperature of the permeable tube which also affects the diffusion rate of the surrounding environment through the permeable tube. Although a tetrafluoroethylene resin tube has been found to work satisfactorily in the present invention it will be understood that other forms of plastic or permeable materials can be used in place thereof.

By now it should be appreciated that there has been provided a new and improved method for entering impurities or dopants into a process gas line in a manner which does not require critical moving parts or parts that have to be closely adjusted. The use of the present invention allows oxygen to be incorporated into an AlGaAs layer to provide a semi-insulating layer wherein the optical and electrical properties are essentially dead. Although the present invention has been illustrated as rending an AlGaAs layer insulating, it will be recognized that the invention is equally applicable to any appropriate semiconductor III–V compound where an impurity may be introduced into the growing material to destroy its electrical and optical properties.

We claim:

1. A method of making a GaAs structure having at least one layer of AlGaAs material and at least one layer of AlGaAs:O material comprising passing carrier gas carrying the Al, Ga, and As through a non-permeable tube to a reaction chamber to provide the layer of AlGaAs, and passing the carrier gas through a permeable tube exposed to a source of oxygen to provide the layer of AlGaAs:O.

2. The method of claim 1 wherein the permeable tube is a tetrafluoroethylene resin tube.

3. The method of claim 1 wherein the source of oxygen is ambient air.

4. A method for metal organic chemical vapor deposition on a substrate-material, comprising:
   placing the substrate material in a reaction chamber;
   passing a carrier gas through a tetrafluoroethylene resin tube, the tetrafluoroethylene resin tube being surrounded by ambient air, the tetrafluoroethylene resin tube acting as a membrane to admit oxygen and water vapor from the ambient air to mix with the carrier gas to deposit a layer made up from the carrier gas and the oxygen onto the substrate material.

5. A process for depositing at least one layer of electrically and optically active material and at least one layer of semi-insulating material on a semiconductor substrate, comprising alternately passing a reactant carrying gas through a non-permeable tube to a reaction chamber to provide the active layer, and passing the reactant carrying gas through a permeable tube surrounded by a source of oxygen to the reaction chamber to provide the semi-insulating layer.

6. A method for providing an impurity into a carrier gas line to a reaction chamber, comprising:
   providing a permeable tube as part of the gas line, and exposing the permeable tube to the impurity causing the impurity to diffuse into the carrier gas through the permeable tube.

7. The method of claim 6 wherein the permeable tube is a tetrafluoroethylene resin tube.

8. The method of claim 6 wherein the reaction chaber is for performing metal organic chemical vapor deposition.

9. The method of claim 8 wherein the impurity is oxygen or an oxygen containing species.

* * * * *